(12) United States Patent
Hristov

(10) Patent No.: US 8,593,424 B2
(45) Date of Patent: *Nov. 26, 2013

(54) TWO-DIMENSIONAL POSITION SENSOR

(75) Inventor: Luben Hristov, Southampton (GB)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/493,031

(22) Filed: Jun. 11, 2012

(65) Prior Publication Data

US 2012/0327016 A1    Dec. 27, 2012

Related U.S. Application Data

(63) Continuation of application No. 12/899,353, filed on Oct. 6, 2010, now Pat. No. 8,223,133, which is a continuation of application No. 11/428,670, filed on Jul. 5, 2006, now Pat. No. 7,821,502.

(60) Provisional application No. 60/697,613, filed on Jul. 8, 2005.

(51) Int. Cl.
  *G06F 3/041*  (2006.01)
  *G06F 3/044*  (2006.01)
  *G08C 21/00*  (2006.01)

(52) U.S. Cl.
  USPC .................... 345/173; 345/156; 178/18.06

(58) Field of Classification Search
  USPC ............. 345/156, 173, 178; 178/18.01, 18.06
  See application file for complete search history.

(56) References Cited

U.S. PATENT DOCUMENTS

| | | | |
|---|---|---|---|
| 4,550,221 A | 10/1985 | Mabusth | |
| 4,954,823 A | 9/1990 | Binstead | |
| 5,463,388 A | 10/1995 | Boie et al. | |
| 5,730,165 A | 3/1998 | Philipp | |
| 5,844,506 A | 12/1998 | Binstead | |
| 5,861,583 A | 1/1999 | Schediwy | |

(Continued)

FOREIGN PATENT DOCUMENTS

| | | |
|---|---|---|
| JP | 06-242875 | 2/1994 |
| JP | 11-134105 | 5/1999 |

(Continued)

OTHER PUBLICATIONS

Office Action and English translation for Japanese Patent Application No. 2006-187791, Sep. 5, 2011.

(Continued)

*Primary Examiner* — Srilakshmi K Kumar
(74) *Attorney, Agent, or Firm* — Baker Botts LLP

(57) ABSTRACT

A capacitive position sensor comprises a substrate having an arrangement of electrodes mounted on a single surface thereof, the electrodes arranged so as to define an array of sensing cells arranged in columns and rows to form a sensing area. Each sensing cell includes a column sensing electrode and a row sensing electrode. The column sensing electrodes of sensing cells in the same column are electrically coupled together, and the row sensing electrodes of sensing cells in the same row are electrically coupled together. Row sensing electrodes of sensing cells at opposing ends of at least one of the rows are connected together by an electrical connection made outside of the sensing area so that there is no requirement for electrical connections to cross within the sensing area, providing a capacitive position sensor having a sensing area with electrodes on only one side of a substrate.

21 Claims, 8 Drawing Sheets

(56) References Cited

U.S. PATENT DOCUMENTS

| | | | |
|---|---|---|---|
| 6,466,036 | B1 | 10/2002 | Philipp |
| 7,372,455 | B2 * | 5/2008 | Perski et al. ............ 345/173 |
| 7,663,607 | B2 | 2/2010 | Hotelling |
| 7,821,502 | B2 | 10/2010 | Hristov |
| 7,875,814 | B2 | 1/2011 | Chen |
| 7,920,129 | B2 | 4/2011 | Hotelling |
| 8,031,094 | B2 | 10/2011 | Hotelling |
| 8,031,174 | B2 | 10/2011 | Hamblin |
| 8,040,326 | B2 | 10/2011 | Hotelling |
| 8,049,732 | B2 | 11/2011 | Hotelling |
| 8,179,381 | B2 | 5/2012 | Frey |
| 2004/0239650 | A1 | 12/2004 | Mackey |
| 2007/0008299 | A1 | 1/2007 | Hristov |
| 2009/0315854 | A1 | 12/2009 | Matsuo |
| 2012/0242588 | A1 | 9/2012 | Myers |
| 2012/0242592 | A1 | 9/2012 | Rothkopf |
| 2012/0243151 | A1 | 9/2012 | Lynch |
| 2012/0243719 | A1 | 9/2012 | Franklin |

FOREIGN PATENT DOCUMENTS

| | | |
|---|---|---|
| TW | 229287 | 9/1994 |
| TW | 200506740 | 2/2005 |
| WO | 2004/061808 | 7/2004 |
| WO | WO 2012/129247 | 9/2012 |

OTHER PUBLICATIONS

Microfilm of JP-UM Application 855-151935 (JP-UM 857-73847 A), May 7, 1982.

Microfilm of JP-UM Application 854-161748 (JP-UM 856-78134 A), Jun. 25, 1981.

Chinese Appln. Serial No. 200610143149.0 Office Action Mailed Oct. 9, 2009, 6 pgs., Oct. 9, 2009.

Chinese Appln. Serial No. 200610143149.0, Office Action mailed Apr. 10, 2009.

IBM Technical disclosure Bulletin, vol. 21, No. 10, Mar. 1979, N. D. Lupat et al. "One layer optically transparent keyboard for input display", p. 3904-3908, Mar. 1979.

Notification of Reason(s) for Rejection from the Japan Patent Office in Japanese Patent Application No. 2006-187791, dated Aug. 27, 2012, 5 pages (with translation), Aug. 27, 2012.

U.S. Appl. No. 61/454,936, filed Mar. 21, 2011, Myers.

U.S. Appl. No. 61/454,950, filed Mar. 21, 2011, Lynch.

U.S. Appl. No. 61/454,894, filed Mar. 21, 2011, Rothkopf.

Translation of the Office Action of the Intellectual Property Office and Search Report ROC (Taiwan) for Patent Application No. 095124551, transmitted to Baker Botts L.L.P. on Jan. 7, 2013.

German Office Action and English translation of German Patent Application 10 2006 031 376.3, ref. P63293AK (13 pgs), Sep. 30, 2013.

\* cited by examiner

TWO-DIMENSIONAL POSITION SENSOR

RELATED APPLICATIONS

This application is a continuation of U.S. application Ser. No. 12/899,353 filed 6 Oct. 2010, which is a continuation of U.S. application Ser. No. 11/428,670 filed 5 Jul. 2006, now U.S. Pat. No. 7,821,502 issued 26 Oct. 2010, which claims priority to U.S. Provisional Application No. 60/697,613 filed 8 Jul. 2005.

BACKGROUND OF THE INVENTION

The invention relates to a capacitive position sensor for determining the position of an object within a two-dimensional sensing area.

The use of two-dimensional touch-sensitive position sensors is becoming more common. Examples include the use of position sensors in laptop computers in place of mouse pointing devices, as control panels for receiving user inputs to control an appliance, or particularly as a glass touchscreen apparatus having an X-Y coordinate output. Some applications require a clear sensing layer so that a display can be viewed beneath the screen, while others only require an opaque touch surface, for example for a keypanel on a kitchen appliance or a PC peripheral.

Touch-sensitive position sensors are frequently preferred to mechanical devices because they provide for a more robust interface and are often considered to be more aesthetically pleasing. Furthermore, because touch-sensitive position sensors require no moving parts to be accessible to a user, they are less prone to wear than their mechanical counterparts and can be provided within a sealed outer surface. This makes their use where there is a danger of dirt or fluids entering a device being controlled particularly attractive.

There exists a large body of art involving 2D touchpanels and screens. They can be generally divided into two classifications: those that report an X-Y coordinate of a more or less continuous nature ('XY' type), and those that have a discrete sensing surface ('discrete' type) having predefined key areas that are fixed by physical geometry. The XY type find dominant use over LCD or other display types while the latter find use in fixed function key panels. There are exceptions to this, for example touchpad surfaces on laptops report XY position but are opaque. XY types invariably involve a sensing surface on the user-side or 'first surface' of the touch area. For example, both continuous resistive and capacitive touch screens involve a sensing layer that must be either physically depressed by the user or touched almost directly, or at most through a thin layer of insulation (as in mouse touchpads). These types require that the product have a bezel opening to allow direct or near-direct contact by the user with the sensing layer. A significant disadvantage of these types is that there has to be an opening in the panel, which requires sealing against moisture and dirt and hence is expensive to mount. Furthermore the sensing layer is directly exposed to abuse and can be easily damaged by sharp objects or abrasion. While robust capacitive types are known which have buried wires inside a glass layer (e.g. U.S. Pat. No. 5,844,506), these still require a bezel opening in a panel which must be sealed, and require two sensing layers as a matrix due to the need to cross X and Y conductors. Furthermore these screens are very expensive to produce and in fact cannot be produced on a mass scale; additionally the sensing circuitry is known to be complex and expensive.

In the field of discrete touch buttons, it has been known for some time that capacitive keys can be placed behind a solid surface having no requirement for a bezel opening. However these types only provide for limited resolution, as predefined by the location of discrete electrode shapes. An example of this can be found in U.S. Pat. No. 4,954,823, FIGS. 4 and 6. While it is well known that these electrodes can be made of a single layer of clear conductor such as Indium Tin Oxide ('ITO') to allow placement over a bezel-less display, for example by the application of the layer as a film on the back of a subsection of a panel, nevertheless the technology is limited to discrete touch areas based on the number, size, and placement of discrete electrodes.

FIG. 1 schematically shows in plan view a touch pad 2 of the type described in U.S. Pat. No. 4,954,823, but laid out in an orthogonal array. The touch pad 2 comprises a grid of discrete electrodes 4 mounted on an insulating substrate 6. Each electrode is connected to a channel of capacitance measurement circuitry in a controller 8. U.S. Pat. No. 5,463,388 describes this geometry in passing in conjunction with its FIG. 1, to show how such an array can be used to determine a position of an object proximate the sensing layer via a method of determining a centroid of the signals from each pad. However U.S. Pat. No. 5,463,388 fails to show how to implement such a design and describes instead a matrix of conductors along with a centroidal calculation of continuous X-Y position. In fact it is not practical to have so many sensing channels as one per sense pad, and a matrix arrangement is much more efficient as described below.

FIG. 2 schematically shows a position sensor 12 based on a matrix of conductors as described in U.S. Pat. No. 5,463,388. The position sensor 12 comprises a number of vertically aligned strip electrodes (columns) 14 mounted on an upper surface of an insulating substrate 16 and a number of horizontally aligned strip electrodes (rows) 15 mounted on an opposing lower surface of the insulating substrate. Each vertical strip electrode is connected to a channel of capacitance measurement circuitry in a controller 18. Thus, this type of position sensor allows an X-Y coordinate output of a continuous nature by means of calculation of a centroid of capacitance among the rows and columns rather than among discrete pads. However this type requires two sensing layers so that the matrix traces can be routed, and does not allow the use of optically clear materials.

The ideal touch surface would eliminate the need for a bezel opening (or at least, make it optional), have an inexpensive sensing surface that is applied to the rear of the panel surface that can project through a reasonable thickness of panel material (e.g. up to 4 mm of glass or plastic), optionally require only one sensing layer with no crossovers in the sensing region, be usable with clear sensing layers such as ITO, have an XY type of output, and have a compact, inexpensive driver circuit. This set of ideal goals has not been achieved with any known prior art.

SUMMARY OF THE INVENTION

According to a first aspect of the invention there is provided a capacitive position sensor for determining the position of an object in a sensing area, the sensor comprising a substrate having a surface with an arrangement of electrodes mounted thereon, wherein the electrodes define an array of sensing cells arranged in columns and rows to form the sensing area, each sensing cell including a column sensing electrode and a row sensing electrode, the column sensing electrodes of sensing cells in the same column being electrically coupled together and the row sensing electrodes of sensing cells in the same row being electrically coupled together, wherein row sensing electrodes of sensing cells at opposing ends of at least one of the rows are electrically coupled to one another by respective row wrap-around connections made outside of the sensing area.

Thus a position sensor having electrodes on only a single layer of a substrate can be provided. Furthermore, because the position sensor employs an intersecting array of columns and rows of sensing electrodes (i.e. a matrix), fewer measurement channels are required than with sensors based on an array of discrete electrodes.

Because the position sensor is based on sensing electrodes on only a single surface, it can be cheaper to manufacture than known double-sided position sensors. This also means the sensing electrodes can be deposited directly onto a surface for which the opposing surface is inaccessible (e.g. a display screen). The sensing electrodes can also be deposited on an inside surface of a device housing, thus removing the need for any protective covering that might be required if electrodes were also required to be on the outer surface.

The electrical row wrap-around connections may comprise a conductive trace mounted on the substrate. This allows the connection outside of the sensing area to be made in the same processing step as the sensing electrodes within it. Alternatively, the row wrap-around connections may be made by a free wire appropriately connected to the respective row sensing electrodes.

The column sensing electrodes of a column of sensing cells at an edge of the sensing area may be electrically coupled to one another by column wrap-around connections made outside of the sensing area in a similar fashion.

The position sensor may further comprise a plurality of capacitance measurement channels connected to respective ones of the rows of row sensing electrodes and the columns of column sensing electrodes, wherein each measurement channel is operable to generate a signal indicative of a capacitance between its associated column or row of sensing electrodes and a system ground.

In addition, the position sensor may further comprise a processor operable to determine the position of the object along the first direction by comparing signals from the columns of column sensing electrodes and along the second direction by comparing signals from the rows of row sensing electrodes.

This allows the determination of the position of a touch to be made using otherwise conventional circuitry connected to the sensing elements.

The capacitance measurement channels may comprise charge transfer circuitry since this provides a reliable and robust way to measure capacitances of the level that might be expected in a typical implementation. However, other forms of capacitance measurement circuitry may equally be used. In general it is preferential to use a capacitive driver circuit that drives all the rows and column connections in a substantially phase-synchronous manner so as to prevent the electric fields from cross-loading into adjacent rows and columns. This is described also in U.S. Pat. No. 5,463,388, where all the rows and column conductors are driven by a single oscillator.

The sensing cells may be arranged into three or four columns. This can provide a position sensor with sufficient resolution over a typically sized sensing area for most applications.

The column and row sensing electrodes in each sensing cell may be interleaved with one another (e.g. by spiraling around one another or being interlaced/intertwined), especially in designs where the row and column spacing is larger than that of a typical finger. This provides for a much more uniform blend of signals from the X and Y drives in each intersecting location, allowing better position reporting with respect to a finger touching the overlying surface. This is described also in U.S. Pat. No. 5,463,388, for example FIG. 2. In layouts where the row and column spacings are similar to or smaller than a human finger it is sufficient to use other arrangements of electrode pattern, for example an array of diamond shapes as shown in FIG. 8 and described further below.

The position sensor may include a transparent substrate and transparent electrodes (e.g. formed from Indium Tin Oxide (ITO) deposited on the substrate). This allows it to be placed over a display screen without obscuring what is displayed beneath. Thus the display screen might be configured to display "virtual" buttons to a user that may be selected by the user placing their finger over the appropriate part of the display adjacent the position sensor. The position of the user's touch can then be compared with the positions of the "virtual" buttons being displayed to determine which one has been selected.

According to a second aspect of the invention there is provided a device comprising a position sensor according to the first aspect of the invention. The position sensor may be used in many types of device. For example the device may be a portable/hand-held device, e.g. a personal data assistant (PDA), a multimedia player, a mobile (cell) phone, a re-configurable remote controller, or a still camera or video camera, for example with the position sensor overlaying a display. Alternatively, the position sensor could equally be used in larger scale devices such as kitchen appliances, kiosks, and the like. Opaque versions can be fashioned for use in PC-style trackpads, keypads, and other human interface devices as are well known in the art.

According to a third aspect of the invention there is provided a method of constructing a capacitively sensitive surface disposed on a substrate which reports an X-Y coordinate position of an object within an active sensing region when the object is adjacent to said surface, comprising the steps of: (a) depositing a single layer of patterned conductive material in the active sensing region, the pattern comprising rows and columns of electrodes connected to individual ones of capacitive sensing channels, and wherein at least one row or column is broken into a plurality of segments within the active region; (b) connecting the broken segments together with an electrical conductor, wherein the conductor is made to lie outside of the active sensing region; (c) connecting the rows and columns to individual sensing channels of a multi-channel capacitive sensor circuit having multiple outputs representing amplitudes of capacitance on the rows and columns; and (d) providing a processor operable to process the multiple outputs to determine a coordinate position of the adjacent object as an XY location.

The processor may be operable to compensate for position distortion introduced by the physical geometry of the patterned conductive material.

The processor may also be operable to calculate a centroid of the signals across rows and a centroid of the signals across columns.

According to a fourth aspect of the invention there is provided a capacitive position sensor for determining the position of an object in a sensing area, the sensor comprising a substrate having a surface with an arrangement of conductive electrodes mounted thereon, wherein the electrodes define an array of sensing cells arranged in columns and rows to form the sensing area, each sensing cell including a column sensing electrode and a row sensing electrode, the column sensing electrodes of sensing cells in the same column being electrically coupled together and the row sensing electrodes of sensing cells in the same row being electrically coupled together, wherein at least one column sensing electrode comprises a continuous spine within the sensing area, and the at least one other column is made electrically continuous via connections external to the sensing area.

BRIEF DESCRIPTION OF THE DRAWINGS

For a better understanding of the invention and to show how the same may be carried into effect reference is now made by way of example to the accompanying drawings in which.

DETAILED DESCRIPTION

Figure 1:
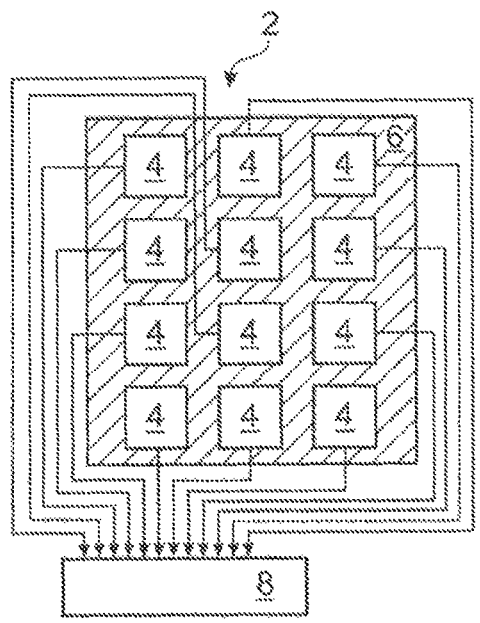
FIG. 1 schematically shows in plan view a known two-dimensional capacitive position sensor.
Figure 2:
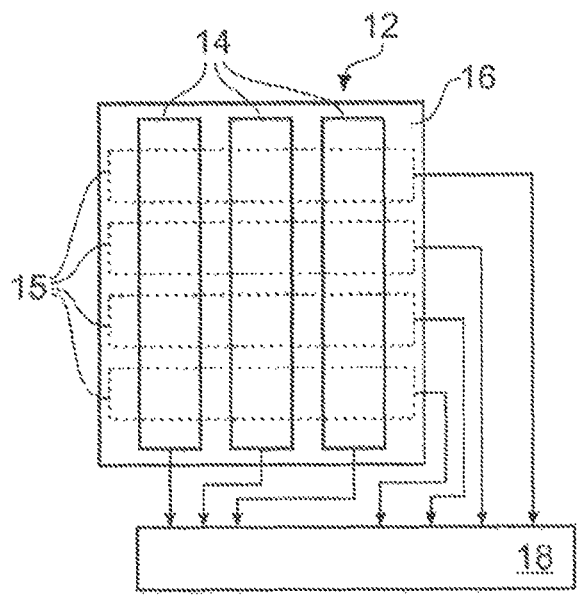
FIG. 2 schematically shows in plan view another known two-dimensional capacitive position sensor.
Figure 3:
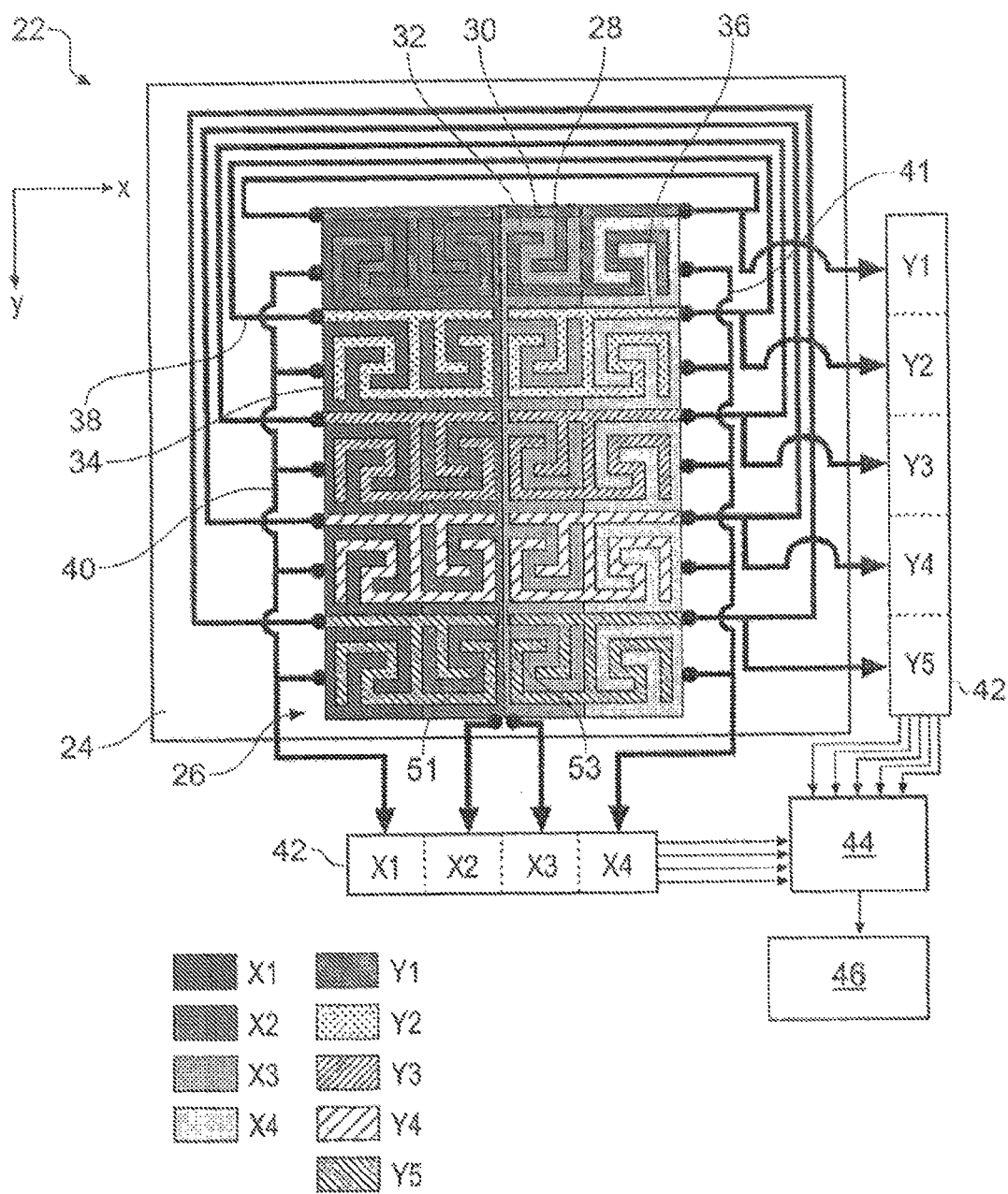
FIG. 3 schematically shows in plan view a two-dimensional capacitive position sensor according to an embodiment of the invention.

FIG. 3 schematically shows in plan view a two-dimensional touch-sensitive capacitive position sensor 22 according to an embodiment of the invention. The position sensor 22 is operable to determine the position of an object along a first (x) and a second (y) direction, the orientation of which are shown towards the top left of the drawing. The sensor 22 comprises a substrate 24 having an arrangement of sensing electrodes 26 mounted thereon. The sensing electrodes 26 define a sensing area within which the position of an object (e.g. a finger or stylus) adjacent the sensor may be determined. The substrate 24 is of a transparent plastics material and the electrodes are formed from a transparent film of Indium Tin Oxide (ITO) deposited on the substrate 24 using conventional techniques. Thus the sensing area of the sensor is transparent and can be placed over a display screen without obscuring what is displayed behind the sensing area. In other examples the position sensor may not be intended to be located over a display and may not be transparent; in these instances the ITO layer may be replaced with a more economical material such as a copper laminate PCB, for example.

The pattern of the sensing electrodes on the substrate 24 is such as to divide the sensing area into an array (grid) of sensing cells 28 arranged into rows and columns. (It is noted that the terms "row" and "column" are used here to conveniently distinguish between two directions and should not be interpreted to imply either a vertical or a horizontal orientation.) By way of example one of the sensing cell 28 is identified by a dotted outline in FIG. 3. In this position sensor there are four columns of sensing cells aligned with the y-direction and five rows of sensing cells aligned with the x direction (twenty sensing cells in total). The top-most row of sensing cells for the orientation shown in FIG. 3 is referred to as row y1, the next one down as row y2, and so on down to row y5. The columns of sensing cells are similarly referred to from left to right as columns x1 to x4. Thus the sensing cell 28 shown with a dotted outline in FIG. 3 is at the intersection of row y1 and column x3.

Each sensing cell includes a row sensing electrode 30 and a column sensing electrode 32. The row sensing electrodes 30 and column sensing electrodes are arranged within each sensing cell 28 to interleave with one another (in this case by squared spiraling around one another), but are not galvanically connected. Because the row and column sensing electrodes are interleaved (intertwined), an object adjacent a given sensing cell can provide a significant capacitive coupling to both sensing electrodes irrespective of where in the sensing cell the object is positioned. The characteristic scale of interleaving may be on the order of, or smaller than, the capacitive footprint of a typical object to be detected to provide the best results. The size and shape of the sensing cell 28 can be comparable to that of the object to be detected or larger (within practical limits).

The row sensing electrodes 30 of all sensing cells in the same row are electrically connected together to form five separate rows of row sensing electrodes. Similarly, the column sensing electrodes 32 of all sensing cells in the same column are electrically connected together to form four separate columns of column sensing electrodes.

The column sensing electrodes in column x2 are connected to one another by a connection 51, also referred to as a spine, made within the sensing area by a part of one of the electrodes deposited on the substrate and which runs between columns x2 and x3. This connection runs the length of the sensing area. Thus a single continuous conductive electrode deposited on the substrate 24 provides the column sensing electrodes 32 of all of the sensing cells in column x2 and their interconnections. The column sensing electrodes in column x3 are similarly connected to one another by a connection 53 made within the sensing area, again running between columns x2 and x3 as a spine. Thus again a single continuous conductive electrode deposited in the substrate 24 provides the column sensing electrodes 32 of all of the sensing cells in column x3 and their interconnections.

The row sensing electrodes 30 in columns x1 and x2 of row y2 are also connected together by a connection made within the sensing area. Thus a single continuous conductive electrode 34 deposited on the substrate 24 provides the row sensing electrodes of the sensing cells in columns x1 and x2 of row y2 and their interconnection. The row sensing electrodes in columns x3 and x4 of row y2 are similarly connected together by a connection made within the sensing area so that a single continuous electrode 36 again provides these row sensing electrodes and their interconnection. However, because of the on-substrate connections (spines) running between columns x2 and x3 to connect between their respective column sensing electrodes, the row sensing electrodes in columns x1 and x2 of row y2 cannot be connected to the row sensing electrodes in columns x3 and x4 of row y2 by a connection made on the surface of the substrate. Thus a connection 38 between the row sensing electrodes at opposing ends of this row (i.e. in columns x1 and x4) is provided outside of the sensing area. The connection 38 runs around the outside of the sensing area to connect the electrode 34 providing the row sensing electrodes in columns x1 and x2 of row y2 with the electrode 36 providing the row sensing electrodes in columns x3 and x4 of row y2. Thus all row sensing electrodes in this row are electrically connected together. Similar wrap-around connections outside of the sensing area are made to ensure the respective row sensing electrodes of the other rows are connected together. It is noted that although one is shown in FIG. 3, a connection outside of the sensing area between the row sensing electrodes at opposing ends of row y1 is not required because the spines connecting between the column sensing electrodes of columns x2 and x3 need not extend to the very edge of the sensing area and a connection running along the top edge of the sensing area could be used to connect between the row sensing electrodes in row y1 (not shown).

Each column sensing electrode in column x1 is formed from a separate electrode on the substrate. These separate electrodes are connected together by connections 40 made external to (i.e. outside of) the sensing area. The column sensing electrodes in column x4 are connected together by connections 41 in a similar manner to those of column x1. In this fashion the outer two columns can be discontinuous within the sensing area to allow access by row electrodes into cells, yet the columns are nevertheless made whole.

In this example the various connections made outside of the sensing area between the row sensing electrodes in sensing cells at opposing ends of the respective rows and the column sensing electrodes in the columns at the periphery of the sensing area are formed from free wires attached to the electrodes of the sensing area as appropriate using conventional techniques. Because the connections are established by free wires, no difficulties arise from the need for the connections made outside of the sensing area to cross one another in places. In an alternative design the connections made outside of the sensing area may be provided by conductive traces on the substrate similar to the electrodes forming the sensing area. This can be beneficial because the electrodes forming the sensing area and the electrical traces making the connections outside of the sensing area can be fabricated in single processing step. Conventional electrical jumpers can be used at the locations where connections outside of the sensing area cross one another. In yet another alternative and more preferable design, the wiring is accomplished by a combination of conductive traces on the substrate similar to the electrodes forming the sensing area connecting some attachment nodes, plus a dielectric insulator deposited on top of these conductors, plus conductive ink (e.g. silver ink) patterned on top of the dielectric insulator to connect together all remaining nodes needing to be joined. This produces a low cost, thin planar surface which requires only well-known processing steps, with no need for discrete jumpers.

It will be appreciated that the numbers of rows and columns do not need to be 5 and 4 respectively as shown in FIG. 3; other numbers of rows and columns may be used to suit different geometries. Also, while the rows and columns are shown to be of the same basic dimension giving rise to square cells 28, the rows and columns may be of non-matching or even non-uniform dimensions giving rise to rectangular cells 28, or possibly other shapes such as trapezoids. Furthermore, in cases where the regions of the cells 28 are interleaved, they do not require angular patterns of interleaving as shown; the interleavings can be circular, spiral, or other shapes to accomplish the same general effect.

The position sensor 22 further comprises a series of capacitance measurement channels 42 coupled to respective ones of the rows of row sensing electrodes and the columns of column sensing electrodes. Each measurement channel is operable to generate a signal indicative of a value of capacitance between the associated column or row of sensing electrodes and a system ground. The capacitance measurement channels 42 are shown in FIG. 3 as two separate banks with one bank coupled to the rows of row sensing electrodes (measurement channels labeled y1 to y5) and one bank coupled to the columns of column sensing electrodes (measurement channels labeled x1 to x4). However, it will be appreciated that in practice all of the measurement channel circuitry will most likely be provided in a single unit such as a programmable or application specific integrated circuit. Furthermore, although nine separate measurement channels are shown in FIG. 3, the capacitance measurement channels could equally be provided by a single capacitance measurement channel with appropriate multiplexing although this is not a preferred mode of operation. Equally the circuitry of the kind described in U.S. Pat. No. 5,463,388 or similar can be used, which while using a scanning multiplexer does drive all the rows and columns with a single oscillator simultaneously in order to propagate a laminar set of sensing fields through the overlying substrate. Preferably, the sensing channels 42 are multiple in-phase charge-transfer sensors of the type described in U.S. Pat. Nos. 5,730,165 or 6,466,036. Driving multiple ones of such sensing circuits in a phase synchronous manner provides for a desirable laminar field flow.

It is also noted that the substrate provides a valuable function in further mixing the electric fields, so that not only are the fields from X and Y lines better mixed above cells 28, but sensing gradients are produced between adjacent ones of cells 28. This gives rise to the ability to provide interpolated positions in both X and Y dimensions even though the dimensions of cells 28 are wider than an actuating object. Thicker panels are noted to give better mixing performance and hence a better ability to interpolate position.

The signals indicative of the capacitance values measured by the measurement channels 42 are provided to processing circuitry 44. The processing circuitry is configured to determine the interpolated position of a capacitive load applied to the sensing area by an object adjacent the position sensor. The interpolated position of the capacitive load along the x-direction is determined from the signals from the capacitance measurement channels associated with the columns of column sensing electrodes and the interpolated position of the capacitive load along the y-direction is determined from the signals from the capacitance measurement channels associated with the rows of row sensing electrodes. Once the position of the object along the x- and y-directions has been determined, the position is reported to a host controller 46 so that it can take appropriate action.

Figure 4:
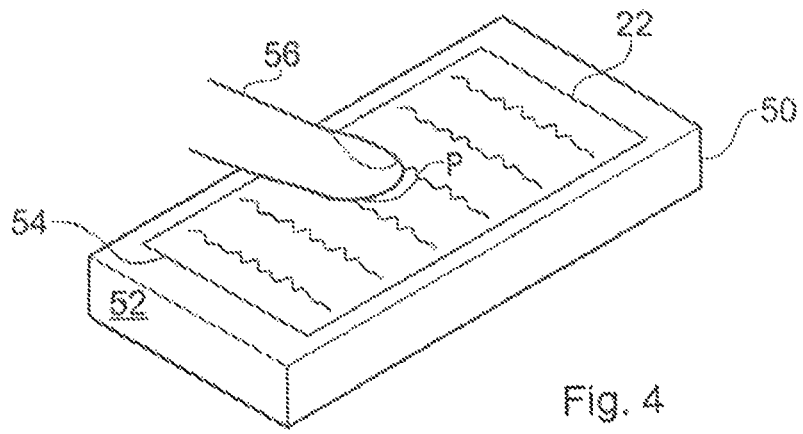
FIG. 4 schematically shows in perspective view a device including the position sensor of FIG. 3.

FIG. 4 schematically shows in perspective view a device 50 including the position sensor 22 shown in FIG. 3. The device in this example is a hand-held multimedia player comprising a housing 52 containing device control electronics (not shown) and a liquid crystal display screen 54. Various lines of text can be seen on the display screen, for example, representing a menu of commands for the device. The sensing area of the position sensor overlays the display screen 54 with the electrical connections between the various column and row sensing electrodes made outside of the sensing area being hidden from view within the housing 52. The electrode layer is completely inside the housing, being underneath the cover plastic, being a film layer that is applied to the interior of the enclosure. This provides for a control surface having no openings and therefore no need for a bezel. The use of a single layer of clear ITO with external node connections provides for high clarity and low cost. A user can select from the menu of commands displayed on the screen 54 by pointing at the appropriate location. The position sensor reports the location of the touch to the device controller which in turn determines which command is to be executed. This is done by comparing the position of the touch with the positions of the currently displayed menu items.

Also shown in FIG. 4 is a finger 56 positioned at a point P adjacent the position sensor 22 and above the display screen 54. The presence of the finger 56 in the vicinity of the position sensor 22 affects the capacitance of each of the rows and columns of sensing electrodes differently depending on the position of the finger within the sensing area. Thus the processing circuitry 44 is able to determine the position of the touch from the signals provided by the respective capacitance measurement channels.

Figure 5A:
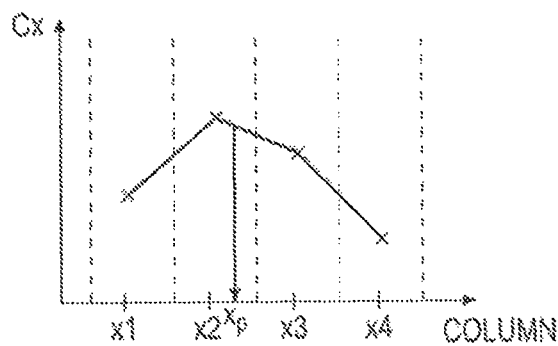
FIGS. 5A and 5B are graphs schematically showing capacitance as function of column number (FIG. 5A) and row number (FIG. 5B) of sensing cells used to determine the position of an object adjacent the position sensor of the device shown in FIG. 4.
Figure 5B:
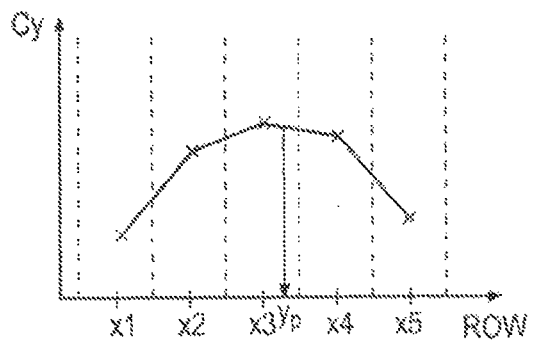

FIGS. 5A and 5B are graphs schematically showing the signals generated by the capacitance measurement channels 42 for the position sensor 22 when the finger 56 is at the position shown in FIG. 4. FIG. 5A shows the signals $C_x$ from respective ones of the columns of column sensing electrodes (x1 to x4). The vertical dotted lines schematically represent the boundaries of each of the columns. FIG. 5B shows the signals $C_y$ from respective ones of the rows of row sensing electrodes (y1 to y5) with the vertical dotted lines representing the boundaries of each of the rows. The signals provided by the capacitance measurement channels have been processed according to conventional techniques, e.g. background capacitance removal, touch threshold detection, normalization and filtering have been performed as desired.

It can be seen from FIG. 5A that the presence of the finger 56 provides the greatest increase in capacitive coupling to system ground for column x2 (i.e. column x2 shows the greatest signal value). This means the point P corresponding to the interpolation or centroid of the capacitive load applied by the finger 56 is within column x2. Furthermore, the increase in capacitive coupling to system ground for column x3 is greater than that for column x1. This means the point P is closer to column x3 than it is to x1. The determination of the position of point P along the x-direction is thus made by comparing the signals from the different columns of column sensing electrodes, and in particular by determining the interpolation or centroid of the signal values. This can be done using conventional processing techniques. In this case the interpolation or centroid of the distribution of signals shown in FIG. 5A is determined to be at position $X_P$. Assuming the columns to be of unit width, and taking the left hand boundary of column x1 to be x=0, point P is at a position along the x-direction of around x=1.8 units, as marked in FIG. 5A by an arrow. A similar analysis is made for the signals from the rows of row sensing electrodes. Assuming the rows to be of unit width, and taking the top most boundary of row y1 to be y=0, point P is at a position $Y_P$ along the y-direction of around y=2.8 units, again as marked an arrow. Thus the position P of the finger is determined to be at (x,y)=(1.8, 2.8). It is noted that the inherent interpolation provided by the different capacitive couplings of the finger to neighboring columns/rows means the centroid or interpolation of the capacitive load applied by the finger (i.e. the deemed position of the touch) can be determined with a resolution that is better than the characteristic size of the sensing cells.

The reported XY position from position sensors according to some embodiments of the invention can be distorted depending on the size, placement and shape of the cells. However, this hardly has any net effect in practical use for menu button usage or other forms of input, as the reported position can be readily corrected, for example via a lookup table, or, the coordinates of menu buttons can be merely compensated for any distortion. The XY distortion caused by the cell size is repeatable from one unit to the next, as it is a physical phenomenon linked to the pattern itself.

Figure 9:
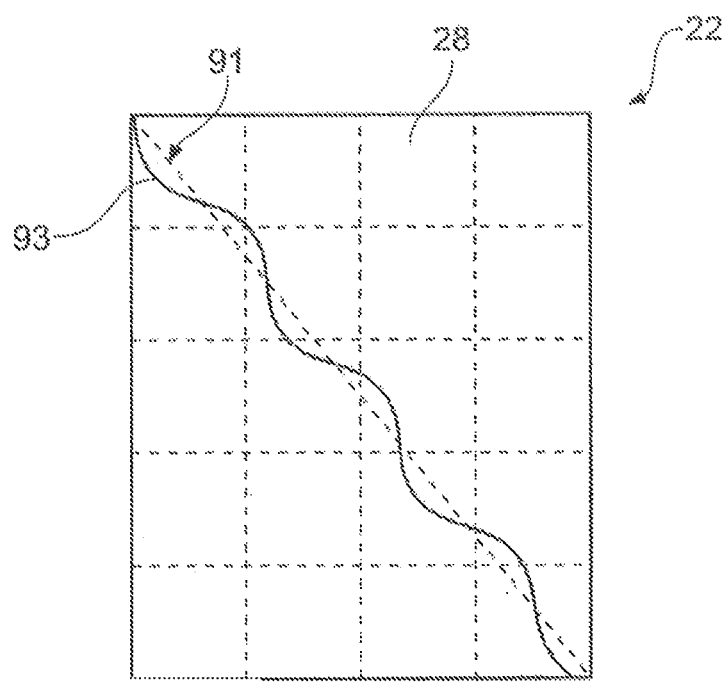
FIG. 9 schematically shows in plan view reported positions compared to actual positions for an object adjacent a position sensor according to an embodiment of the invention.
Figure 10:
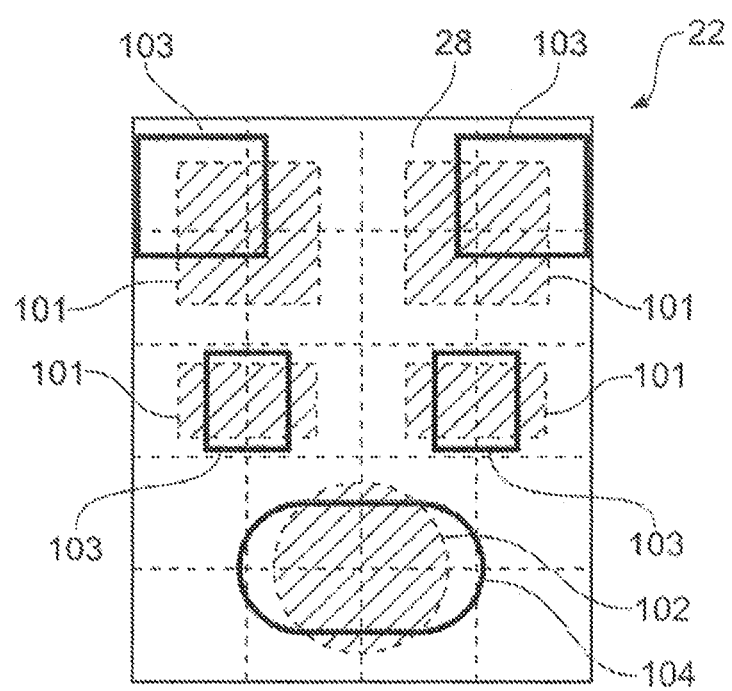
FIG. 10 schematically shows in plan view a display of the outlines of desired key positions compared to the outlines of reported key positions for a position sensor according to an embodiment of the invention.

For example, FIG. 9 shows a keypad or touchscreen of the type of FIG. 3, having a 5×4 array of sensing cells 28, with a diagonal line 91 drawn across the surface from top left to bottom right. The actual reported position may instead be as per solid line 93. The reported line 93 can be readily corrected in X and Y using a correction algorithm or lookup table so the final reported position is corrected to be properly along ideal line 91. Alternatively keys that are mapped into the sensitive area of the position sensor 22 can be inverse-distorted to compensate for the reported distortion as shown in FIG. 10. Here, physically desired key outlines 101 and 102 are distorted into reported shapes 103 and 104. Rather than attempt to correct the reported X-Y data, the key outlines for purposes of key recognition can be distorted into the same reported outline shapes 103 and 104 as shown. If this is done, the reported keys are made identical to the desired shapes 101 and 102.

Figure 6:
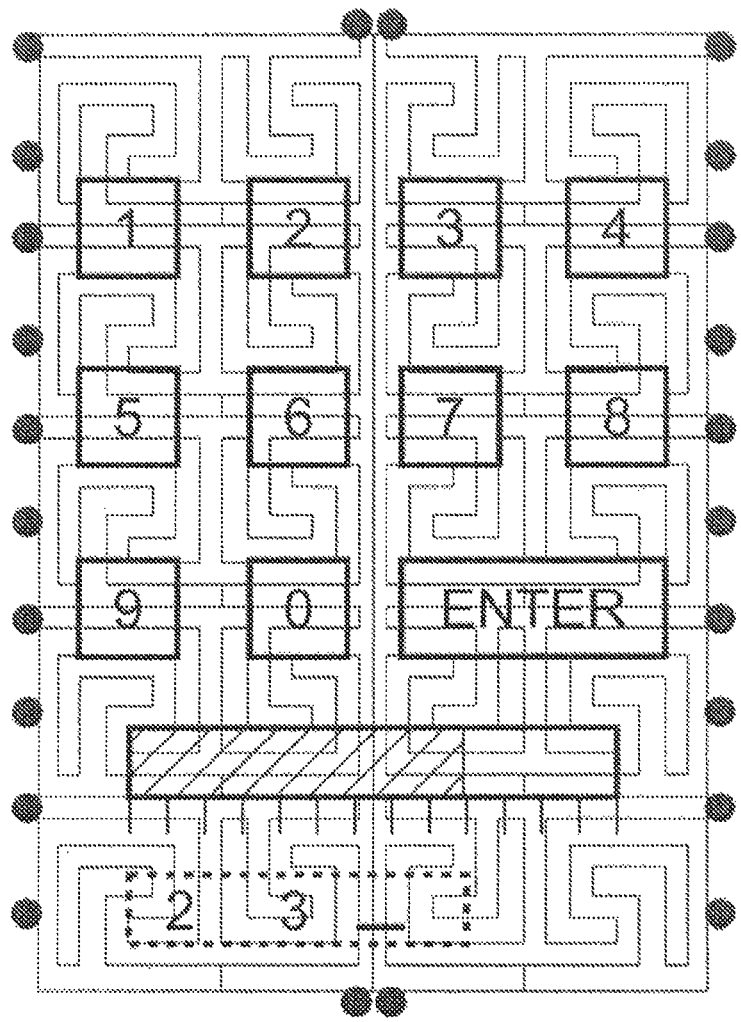
FIG. 6 schematically shows in plan view the two-dimensional capacitive position sensor and display screen of the device shown in FIG. 4.

FIG. 6 schematically shows a plan view of the display screen 54 of the device 50 shown in FIG. 4 displaying a menu of commands. The menu of commands displayed to a user includes a series of box outlines in which the numbers 0 to 9 are displayed, a box outline containing the word "ENTER", and a box outline of a box partially filled with shading and having gradations marked next to it representing the volume of music being played as a fraction of maximum volume. Also shown on the display 54 is a region bounded by a dotted line and showing some previously entered commands. The pattern of sensing electrodes associated with the position sensor overlaying the display screen is also shown in FIG. 6, although it will be appreciated that the position sensor is transparent and would not be visible in practice. Since the sensing layer and associated electronics is able to report an X-Y location, the position of buttons is arbitrary as it would be with any analogue touch screen input device. Thus, any known interface schema can be deployed over the face of the screen, such as menu buttons, sliders, wheels, gesture recognition, character recognition, and the like. Furthermore these schemes do not need to be aligned with the cells, and can be placed arbitrarily over the surface.

Figure 7:
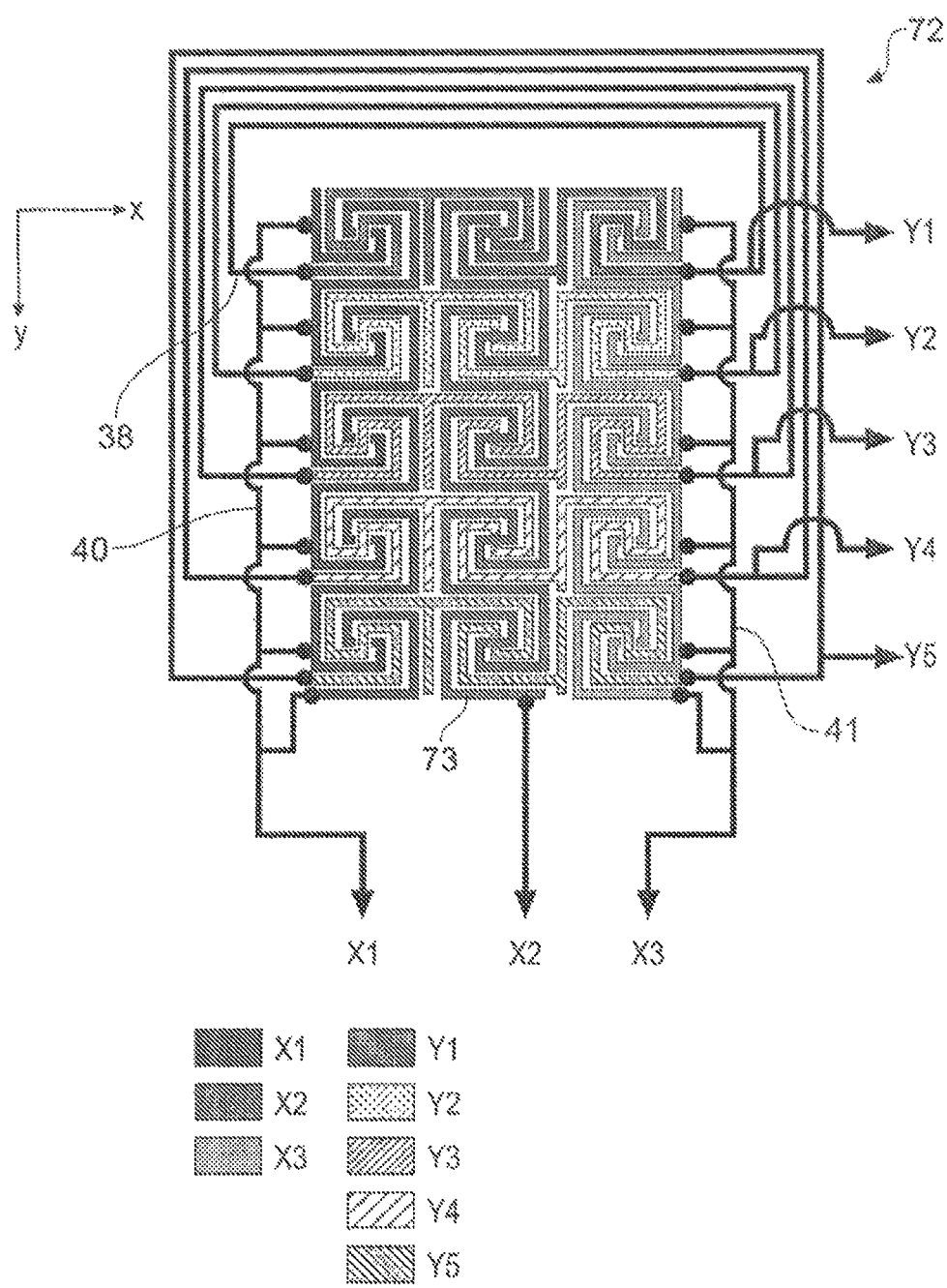
FIGS. 7 and 8 schematically show in plan view two-dimensional capacitive position sensors according to other embodiments of the invention.

FIG. 7 schematically shows in plan view a two-dimensional capacitive position sensor 72 according to another embodiment of the invention. This position sensor again has five rows of sensing cells (labeled y1 to y5) but has only three columns of sensing cells (labeled x1 to x3). Column X2 forms a continuous spine 73 in the sensor area, and connections 38 (similar to the correspondingly numbered connections shown in FIG. 3) are shown which connect the rows together externally to the sensing area and connections 40, 41 (similar to the correspondingly numbered connections shown in FIG. 3) make the outer columns continuous externally to the sensing area. This position sensor has a total of fifteen sensing cells. This means it will generally have less positional resolution along the x-direction than the position sensor 22 shown in FIG. 3 if it were to have same size sensing area as that sensor. Alternatively, it may have the same (or better) positional resolution if it has a smaller sensing area than the sensor shown in FIG. 3. The operation of the position sensor 72 shown in FIG. 7 is otherwise similar to and will be understood from the position sensor 22 of FIG. 3.

Figure 8:
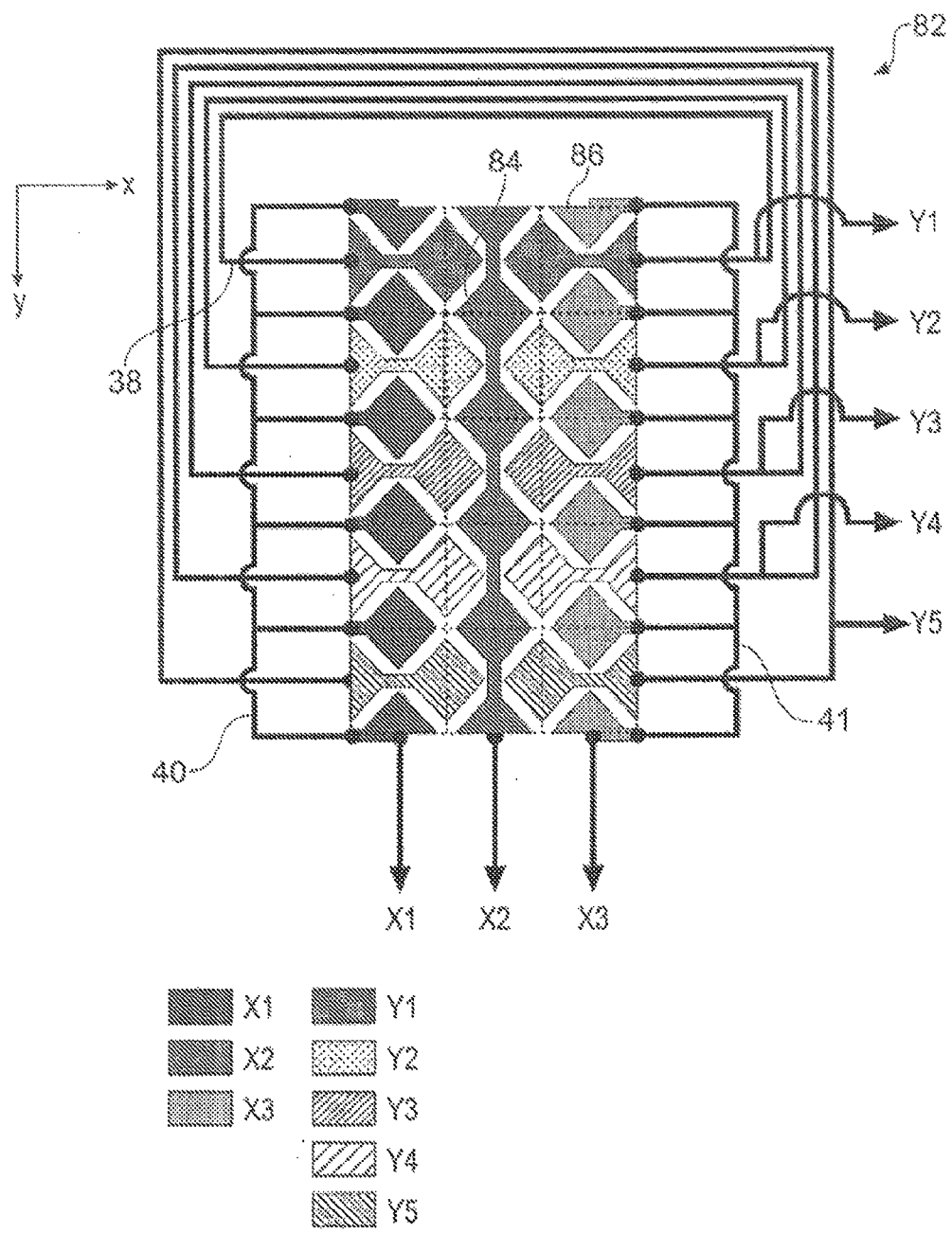

FIG. 8 schematically shows in plan view a two-dimensional capacitive position sensor 82 according to another embodiment of the invention. This position sensor has five rows and three columns of sensing cells. A first 84 and a second 86 sensing cell are identified by dotted outlines. In this example, the row and column sensing electrodes of each sensing cell do not spiral around one another. In sensing cells in column x2 (e.g. sensing cell 84) the column sensing electrode runs continuously through the sensing cell as a spine, with the row sensing electrode comprising two conductive regions on either side of the column sensing electrode. In sensing cells in columns at the edge of the sensing area (i.e. columns x1 and x3, e.g. sensing cell 86) the row sensing electrode runs continuously through the sensing cell with the column sensing electrode comprising two conductive regions on either side of the row sensing electrode. The operation of the position sensor 82 shown in FIG. 8 is otherwise similar to and will be understood from the position sensors 22, 72 of FIGS. 3 and 7. It will be understood the sensing cells of FIG. 8 may also be considered to be interleaved, albeit in a minimal fashion. This shows that other basic shapes are also possible other than diamonds or closely intertwined traces. The important aspect is that in a cell, there exists a portion of a row electrode and a portion of a column electrode.

The size of the sensing area in a given position sensor will depend on its implementation. For example in a hand-held mobile device of the kind shown in FIG. 4, a sensing area on the order of 4 cm (x-direction) by 5 cm (y direction) might be suitable. This would provide sensing cells on the order of 1 cm$^2$. This is comparable to the typical size of a finger tip and so can ensure there is good capacitive coupling to both the row and column sensing electrodes within each cell when used to sense the position of a user's finger. However, larger or smaller sensing areas could equally be employed. There is also no need for the columns and rows to have the same widths, although if they were different it would mean the positional resolution might be different in the two directions.

Furthermore, there is no limit on the number of rows that may used while still providing for a sensing area having a single layer of sensing electrodes within the sensing area (i.e. sensing electrodes on one side of the substrate only). The patterns shown in FIGS. 3, 7 and 8 may simply be repeated in y with corresponding additional capacitance measurement channels being provided for the additional rows of row sensing electrodes. However, it is not possible to have both more than four rows and more than four columns for a position sensor having sensing electrodes on one side of the substrate only.

It will also be understood that it is not necessary for the position sensor to have a continuous spine within the sensing area to connect between column sensing electrodes in columns that are not at an edge of the sensing area. For example, the spines associated with columns x2 and x3 in FIG. 3 could be broken at some point along their length with connections made outside of the sensing area between the respective groups of column sensing electrodes above and below the break. For example, the spines could be broken between rows y2 and y3 so that the row sensing electrodes in columns x1 and x2 of these rows can be connected to the row sensing electrodes in columns x3 and x4 by connections made within the sensing area through the break in the spines. There would then be no need for connections made outside of the sensing area for these rows, although connections outside of the sensing area would be needed for columns x2 and x3.

It will be appreciated that position sensors embodying the invention may incorporate a variety of additional features. For example, in some applications it is desirable to have a 'wakeup' function, whereby the entire device 'sleeps' or is in some quiescent or background state. In such cases, it is often desirable to have a wake signal from mere proximity of a human body part some distance away. The element can be driven as a single large capacitive electrode without regard to position location, while the unit is in the background state. During this state the electronic driver logic looks for a very small change in signal, not necessarily enough to process as a 2D coordinate, but enough to determine that an object or human is in proximity. The electronics then 'wakes up' the overall system and the element is driven so as to become a true position sensor once again.

Finally, it is noted that although the term "touch" is frequently used in the above description, a position sensor of the kind described above can be sufficiently sensitive that it is able to register the location of an adjacent finger (or other object such as a stylus) without requiring physical contact. The term "touch" as used herein should therefore be interpreted accordingly.

What is claimed is:

1. A device comprising:
a graphical display;
a sensing area-defined on a surface of a substrate that overlays the graphical display, the graphical display being visible through the sensing area; and
a plurality of sensing cells arranged in the sensing area in a plurality of rows and columns, the sensing cells being configured to sense a position of an object within the sensing area, each of the sensing cells comprising a row-sensing electrode and a column-sensing electrode, the row-sensing electrode of each of one or more of the sensing cells being continuous with respect to the row-sensing electrode of each of one or more of the sensing cells adjacent to it in its row, the column-sensing electrode of each of one or more of the sensing cells being continuous with respect to the column-sensing electrode of each of one or more of the sensing cells adjacent to it in its column, the column-sensing electrode and the row-sensing electrode in each sensing cell being spirally interleaved with one another; and
a processor in communication with the plurality of sensing cells and operable to correlate the position of the object within the sensing area with a virtual button associated with the graphical display.

2. The sensor of claim 1, further comprising a column wrap-around connection coupling a portion of the column-sensing electrode located at opposing ends of the columns of the sensing cells, the column wrap-around connection provided along a periphery of the sensing area.

3. The sensor of claim 1, further comprising a row wrap-around connection coupled to a portion of the row-sensing electrode located at opposing ends of the rows of the sensing cells, the row wrap-around connection comprises a conductive trace deposited on the substrate along a periphery of the sensing area.

4. The sensor of claim 3, further comprising a column wrap-around connection coupling a portion of the column-sensing electrode located at opposing ends of the columns of the sensing cells, the column wrap-around connection provided along a periphery of the sensing area.

5. The sensor of claim 1, wherein one or more of the row-sensing electrodes is continuous with respect to the row-sensing electrode of each of one or more of the sensing cells adjacent to it in its row and its column-sensing electrode is also continuous with respect to the column-sensing electrode of each of one or more of the sensing cells adjacent to it in its column.

6. The sensor of claim 1, further comprising a plurality of capacitance measurement channels connected to respective ones of the row-sensing and column-sensing electrodes, wherein each measurement channel is operable to generate a signal indicative of a capacitance between its associated row-sensing or column-sensing electrodes and a system ground.

7. The sensor of claim 1, wherein the sensing area is defined on a substrate comprising a transparent material.

8. The sensor of claim 1, wherein the row-sensing and column-sensing electrodes comprise a transparent electrically conductive material.

9. A method comprising:
displaying a plurality of virtual buttons on a graphical display;
sensing a position of an object within a sensing area defined on a surface of a substrate that overlays the graphical display, the graphical display being visible through the sensing area, the sensing area comprising a plurality of sensing cells arranged in a plurality of rows and columns, the sensing cells being configured to sense a position of an object within the sensing area, each of the sensing cells comprising a row-sensing electrode and a column-sensing electrode, the row-sensing electrode of each of one or more of the sensing cells being continuous with respect to the row-sensing electrode of each of one or more of the sensing cells adjacent to it in its row, the column-sensing electrode of each of one or more of the sensing cells being continuous with respect to the column-sensing electrode of each of one or more of the sensing cells adjacent to it in its column, the column-sensing electrode and the row-sensing electrode in each sensing cell being spirally interleaved with one another;
communicating a plurality of signals resulting from a capacitance sensed by the row-sensing and column-sensing electrodes and indicative of the position of the object within the sensing area; and
correlating the position of the object within the sensing area with a selected one of the plurality of virtual buttons displayed on the graphical display.

10. The method of claim 9, wherein the sensing area further comprises a column wrap-around connection coupling a portion of the column-sensing electrode located at opposing ends of the columns of the sensing cells, the column wrap-around connection provided along a periphery of the sensing area.

11. The method of claim 9, wherein the sensing area further comprises a row wrap-around connection coupled to a portion of the row-sensing electrode located at opposing ends of the rows of the sensing cells, the row wrap-around connection comprises a conductive trace deposited on the substrate along a periphery of the sensing area.

12. The method of claim 11, wherein the sensing area further comprises a column wrap-around connection coupling a portion of the column-sensing electrodes located at opposing ends of the columns, the column wrap-around connection provided-along a periphery of the sensing area.

13. The method of claim 9, wherein one or more of the row-sensing electrodes of each of one or more of the sensing cells is continuous with respect to the row-sensing electrode of each of one or more of the sensing cells adjacent to it in its row and its column-sensing electrode is also continuous with respect to the column-sensing electrode of each of one or more of the sensing cells adjacent to it in its column.

14. The method of claim 9, wherein the substrate comprises a transparent material.

15. The method of claim 9, wherein row-sensing and column-sensing electrodes comprise a transparent electrically conductive material.

16. A computer-readable non-transitory storage media embodying logic that is operable when executed to:
display a plurality of virtual buttons on a graphical display;
sense a position of an object within a sensing area defined on a surface of a substrate that overlays the graphical display, the sensing area comprising a plurality of sensing cells arranged in a plurality of rows and a plurality of columns, the sensing cells being configured to sense a position of an object within the sensing area, each of the sensing cells comprising a row-sensing electrode and a column-sensing electrode, the row-sensing electrode of each of one or more of the sensing cells being continuous with respect to the row-sensing electrode of each of one or more of the sensing cells adjacent to it in its row, the column-sensing electrode of each of one or more of the sensing cells being continuous with respect to the column-sensing electrode of each of one or more of the sensing cells adjacent to it in its column, the column-sensing electrode and the row-sensing electrode in each sensing cell being spirally interleaved with one another;
communicate a plurality of signals resulting from a capacitance sensed by the row-sensing and column-sensing electrodes indicative of the position of the object within the sensing area; and
correlate the position of the object within the sensing area with a selected one of the plurality of virtual buttons displayed on the graphical display.

17. The media of claim 16, further comprising a column wrap-around connection coupling a portion of the column-sensing electrode located at opposing ends of the columns of the sensing cells, the column wrap-around connection provided along a periphery of the sensing area.

18. The media of claim 16, wherein the sensing area further comprises a row wrap-around connection coupled to a portion of the row-sensing electrode located at opposing ends of the rows of the sensing cells, the row wrap-around connection comprises a conductive trace deposited on the substrate along a periphery of the sensing area.

19. The media of claim 16, wherein one or more of the row-sensing electrodes of each of one or more of the sensing cells is continuous with respect to the row-sensing electrode of each of one or more of the sensing cells adjacent to it in its row and its column-sensing electrode is also continuous with respect to the column-sensing electrode of each of one or more of the sensing cells adjacent to it in its column.

20. The media of claim 16, wherein the substrate comprises a transparent material.

21. The media of claim 16, wherein the row-sensing and column-sensing electrodes comprise a transparent electrically conductive material.

* * * * *